US009869741B2

(12) United States Patent
Blumhagen et al.

(10) Patent No.: US 9,869,741 B2
(45) Date of Patent: Jan. 16, 2018

(54) METHOD FOR IMAGING A PART REGION OF AN EXAMINATION OBJECT IN A MAGNETIC RESONANCE SYSTEM

(71) Applicant: Siemens Aktiengesellschaft, Munich (DE)

(72) Inventors: Jan Ole Blumhagen, Erlangen (DE); Matthias Fenchel, Erlangen (DE); Ralf Ladebeck, Erlangen (DE); Harald H. Quick, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 953 days.

(21) Appl. No.: 14/248,522

(22) Filed: Apr. 9, 2014

(65) Prior Publication Data

US 2014/0306704 A1 Oct. 16, 2014

(30) Foreign Application Priority Data

Apr. 12, 2013 (DE) ........................ 10 2013 206 580

(51) Int. Cl.
*G01R 33/565* (2006.01)
*G01R 33/34* (2006.01)
(Continued)

(52) U.S. Cl.
CPC . *G01R 33/56563* (2013.01); *G01R 33/56572* (2013.01); *G01R 33/34007* (2013.01);
(Continued)

(58) Field of Classification Search
CPC ............ G01R 33/481; G01R 33/56563; G01R 33/56572; G01R 33/34007; G01R 33/383; G01R 33/4824
(Continued)

(56) References Cited

U.S. PATENT DOCUMENTS 6,967,479 B2 11/2005 Polzin et al.
8,810,243 B2 * 8/2014 Blumhagen .......... G01R 33/445
324/307
(Continued)

FOREIGN PATENT DOCUMENTS

DE 102010044520 A1 3/2012
DE 102011005728 A1 9/2012
(Continued)

OTHER PUBLICATIONS

German Office Action for DE102013206580.9 dated Mar. 12, 2014.
German Priority Document German Application 102013206580.9 filed Apr. 12, 2013.

*Primary Examiner* — Melissa Koval
*Assistant Examiner* — Rishi Patel
(74) *Attorney, Agent, or Firm* — Harness, Dickey & Pierce

(57) ABSTRACT

A method for imaging a part region of an examination object in a magnetic resonance system. In an embodiment, a first and second gradient field are respectively created such that, at a respective first and second position at the edge of the field of view, a distortion caused by a non-linearity of the respective first and second gradient field, and a distortion caused by a Bo field inhomogeneity, cancel each other out. By way of the respective first and second gradient, respective first and second magnetic resonance data which contains the respective first and second position are acquired. A first and second respective readout direction, in which the respective first and second magnetic resonance data are acquired, are selected as a function of a location of the respective first and second position. From the magnetic resonance data, an image of the part region is defined.

30 Claims, 4 Drawing Sheets

(51) Int. Cl.
 *G01R 33/383* (2006.01)
 *G01R 33/48* (2006.01)

(52) U.S. Cl.
 CPC .......... *G01R 33/383* (2013.01); *G01R 33/481* (2013.01); *G01R 33/4824* (2013.01)

(58) Field of Classification Search
 USPC ................................................ 324/307, 309
 See application file for complete search history.

(56) References Cited

U.S. PATENT DOCUMENTS

| | | |
|---|---|---|
| 2012/0056621 A1 | 3/2012 | Blumhagen et al. |
| 2012/0235680 A1 | 9/2012 | Blumhagen et al. |
| 2013/0057282 A1* | 3/2013 | Blumhagen ............ A61B 5/055 324/309 |
| 2013/0082702 A1 | 4/2013 | Blumhagen et al. |
| 2013/0237806 A1 | 9/2013 | Blumhagen et al. |

FOREIGN PATENT DOCUMENTS

| | | |
|---|---|---|
| DE | 102011083898 A1 | 4/2013 |
| DE | 102012203782 A1 | 9/2013 |

* cited by examiner

FIG 4
(a) 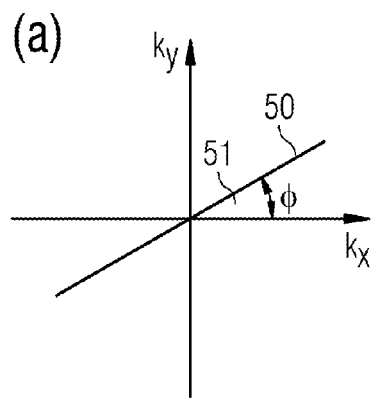
(b) 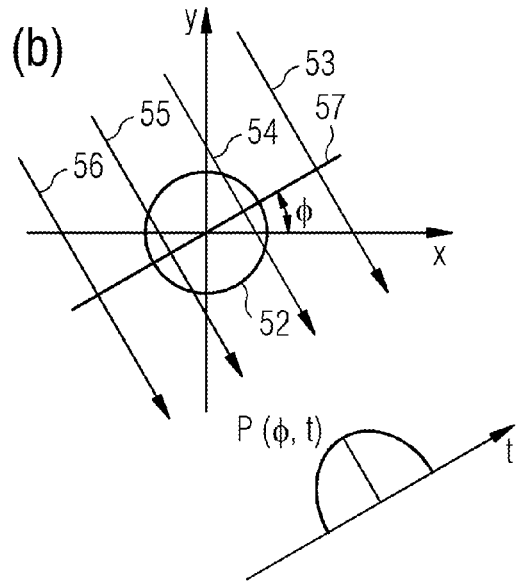
FIG 5
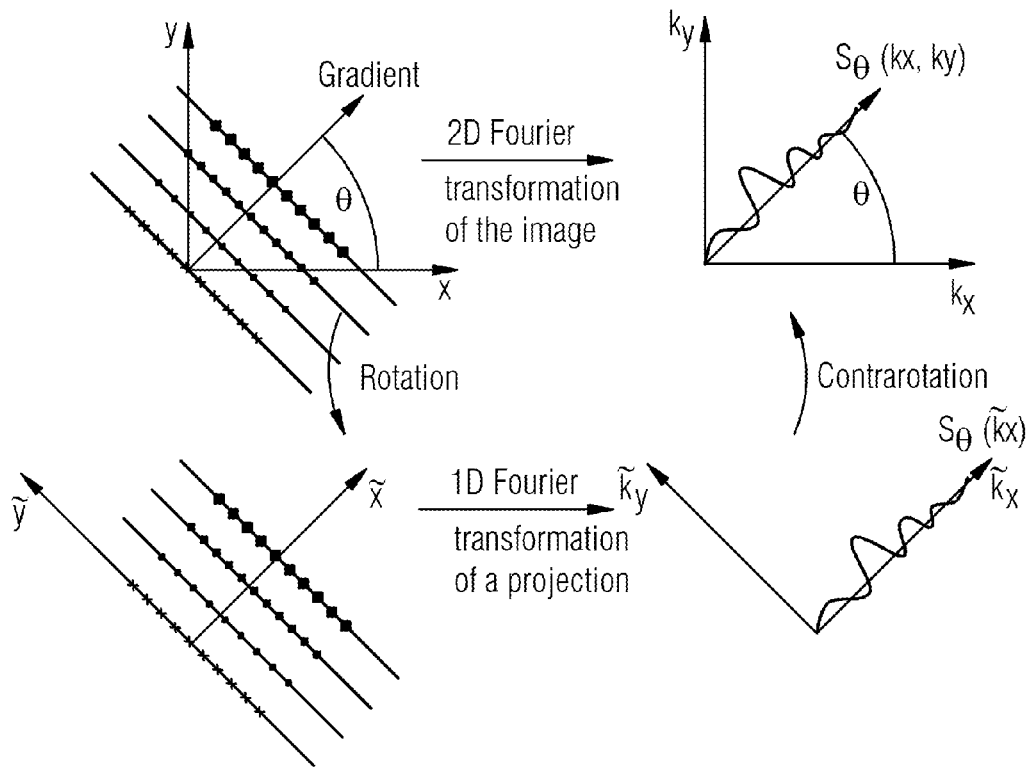

METHOD FOR IMAGING A PART REGION OF AN EXAMINATION OBJECT IN A MAGNETIC RESONANCE SYSTEM

PRIORITY STATEMENT

The present application hereby claims priority under 35 U.S.C. §119 to German patent application number DE 102013206580.9 filed Apr. 12, 2013, the entire contents of which are hereby incorporated herein by reference.

FIELD

At least one embodiment of the present invention generally relates to a method for imaging a part region or a number of part regions of an examination object in a magnetic resonance system and/or to a magnetic resonance system for this purpose. At least one embodiment of the present invention relates especially to a method for imaging one or more part regions of an examination object which are located in a region outside a normally usable field of view of the magnetic resonance system.

BACKGROUND

With a magnetic resonance system, the measurable volume for acquiring a magnetic resonance tomography image is restricted because of physical and technical conditions in all three spatial directions. The physical and technical conditions relate especially to a magnetic field inhomogeneity of the basic magnetic field and a non-linearity of the gradient field. This means that an imaging volume, known as a field of view (FOV), is restricted to a volume in which the aforementioned physical features lie within a predetermined tolerance range and thereby allow imaging of the examination object faithful to the original and faithful to the location.

The thus delimited and usually usable field of view is significantly smaller, especially in the x and y-direction, i.e. at right angles to a longitudinal axis of a tunnel of the magnetic resonance system, than the volume delimited by the ring tunnel of the magnetic resonance system. With usual magnetic resonance systems a diameter of the ring tunnel amounts for example to approximately 60 cm, while the diameter of the usually used field of view, in which the aforementioned physical features lie within the tolerance range, amounts to approximately 50 cm.

With many applications of magnetic resonance tomographies this shortcoming, that no imaging of the measurement object which is faithful to the original is possible in the edge area of the tunnel, does not represent a particular problem, since with many magnetic resonance images usually the region of the examination object can be disposed in the magnetic resonance system such that this region is located not at the edge of the tunnel, but where possible in the center of the tunnel, in what is referred to as the isocenter of the magnetic resonance system. With other applications it is however frequently of great importance to be able to define structures of the examination object even in the edge area as exactly as possible. This relates for example to hybrid systems including a magnetic resonance tomograph (MR) and a positron emission tomograph (PET).

With such MR-PET hybrid systems for example the human attenuation correction for the positron emission tomography is determined by way of the magnetic resonance tomography. With the human attenuation correction the intensity attenuation of the photons emitted after interaction of positrons and electrons on their way through absorbing tissue to the detector is determined and the received signal of the PET is corrected by precisely this attenuation. For this purpose a magnetic resonance image is required, which maps the complete anatomy of the object to be examined in the direction of the high-energy photons emitted by the positron emission tomography. Therefore the anatomy of the object to be examined is to be captured as precisely as possible even in the edge region of the tunnel of the hybrid system.

Structures which are located in these regions are for example above all the arms and the stomach of the patient to be examined, which can be disposed in the edge region close to the tunnel inner wall of the hybrid system. Further applications, which need a highly locationally-accurate magnetic resonance image, for example magnetic resonance-based interventions, magnetic resonance-based radiation treatment planning, whole-body magnetic resonance tomographies for magnetic resonance oncologies and magnetic resonance angiographies, especially when used for short magnets with restricted field of view, and with post-processing applications, such as a data fusion with locationally-faithful imaging methods such as e.g. a computed tomography (CT) or a positron emission tomography (PET).

In the patent application with the reference number DE 10 2010 044520 A1, the entire contents of which are hereby incorporated herein by reference, a method is provided for imaging a part region of an examination object in a magnetic resonance system. For imaging sequences an optimum gradient amplitude is selected in the readout direction so that a resulting distortion caused by $B_0$ field inhomogeneities and gradient non-linearities becomes minimal. Typical regions of the body outside the specified field of view, such as the arms for example, can thus be presented distortion-free, in that the x-axis is selected for the readout gradient.

SUMMARY

The inventors have discovered that this compensation technique only functions, however, in the frequency coding direction and not in the phase coding direction, since in the phase coding direction the $B_0$ field inhomogeneities do not contribute to the distortion. The gradient non-linearities can thus not be compensated for on the sequence side in this direction. With a normal spin echo sequence with Cartesian sampling, this leads to a direction-dependent restriction of the region which can be optimized. To detect any part regions of the patient, for example the arm and the stomach of the patient, the inventors note that there is therefore a need to be able to correct distortions in any given directions.

At least one embodiment of the present invention is directed to a method for imaging a part region of an examination object in a magnetic resonance system, a magnetic resonance system, a computer program product and/or an electronically-readable data medium. The dependent claims define preferred and advantageous embodiments of the invention.

In accordance with at least one embodiment of the present invention, a method is provided for imaging a part region of the examination object in a magnetic resonance system. The part region is disposed at the edge of a field of view of the magnetic resonance system. In the method, a first gradient field is created such that, at a first predetermined position at the edge of the field of view, a distortion caused by a non-linearity of the first gradient field and a distortion caused by a $B_0$ field inhomogeneity cancel each other out.

By way of the first gradient field, first magnetic resonance data is detected which contains the first predetermined position. A second gradient field is created such that, at a second predetermined position at the edge of the field of view, a distortion caused by a non-linearity of the second gradient field and a distortion caused by a $B_0$ field inhomogeneity cancel each other out. By way of the second gradient field, second magnetic data is detected which contains the second predetermined position.

The first predetermined position and the second predetermined position are different and can for example be selected such that the first predetermined position is in the region of one arm of the patient at the edge of the field of view and the second predetermined position is in the region of a patient's stomach at the edge of the field of view. A first readout direction, in which the first magnetic resonance data is detected, is selected as a function of a location of the first predetermined position and a second readout direction, in which the second magnetic resonance data is detected, is selected as a function of a location of the second predetermined position. The first readout direction and the second readout direction are different.

In accordance with an embodiment of the invention, a magnetic resonance system is also provided which has a control device for controlling a tomograph with a magnet for generating a $B_0$ field, a receive facility for receiving signals accepted by the tomograph and an evaluation facility for evaluating the signals and creation of magnetic resonance images. The magnetic resonance system is capable of creating a first gradient field such that, at a first predetermined position at the edge of the field of view, a distortion caused by a non-linearity of the first gradient field and a distortion caused by a $B_0$ field inhomogeneity cancel each other out. With the aid of the first gradient field thus created the magnetic resonance system creates first magnetic resonance data which contains the first predetermined position.

In accordance with an embodiment of the present invention, a computer program product is also provided, which can be loaded into a memory of a programmable controller of a magnetic resonance system. The computer program product can especially comprise software. With program segments/modules of this computer program product, all previously described embodiments of the inventive method can be executed when the computer program product is executed in the magnetic resonance system.

In accordance with an embodiment of the invention, an electronically-readable data medium, for example a CD or DVD, is also provided, on which electronically-readable control information, especially software, is stored. When this control information is read from the data medium and stored in a control unit of the magnetic resonance system, all inventive embodiments of the previously described method can be carried out with the magnetic resonance system.

BRIEF DESCRIPTION OF THE DRAWINGS

The present invention will be described below with reference to the drawings on the basis of example embodiments.

FIG. 4 shows schematically a straight line projection through the k-space during a radial acquisition of magnetic resonance data of an object.

FIG. 5 shows schematically an acquisition of magnetic resonance data during radial sampling of an object.

DETAILED DESCRIPTION OF THE EXAMPLE EMBODIMENTS

Figure 1:
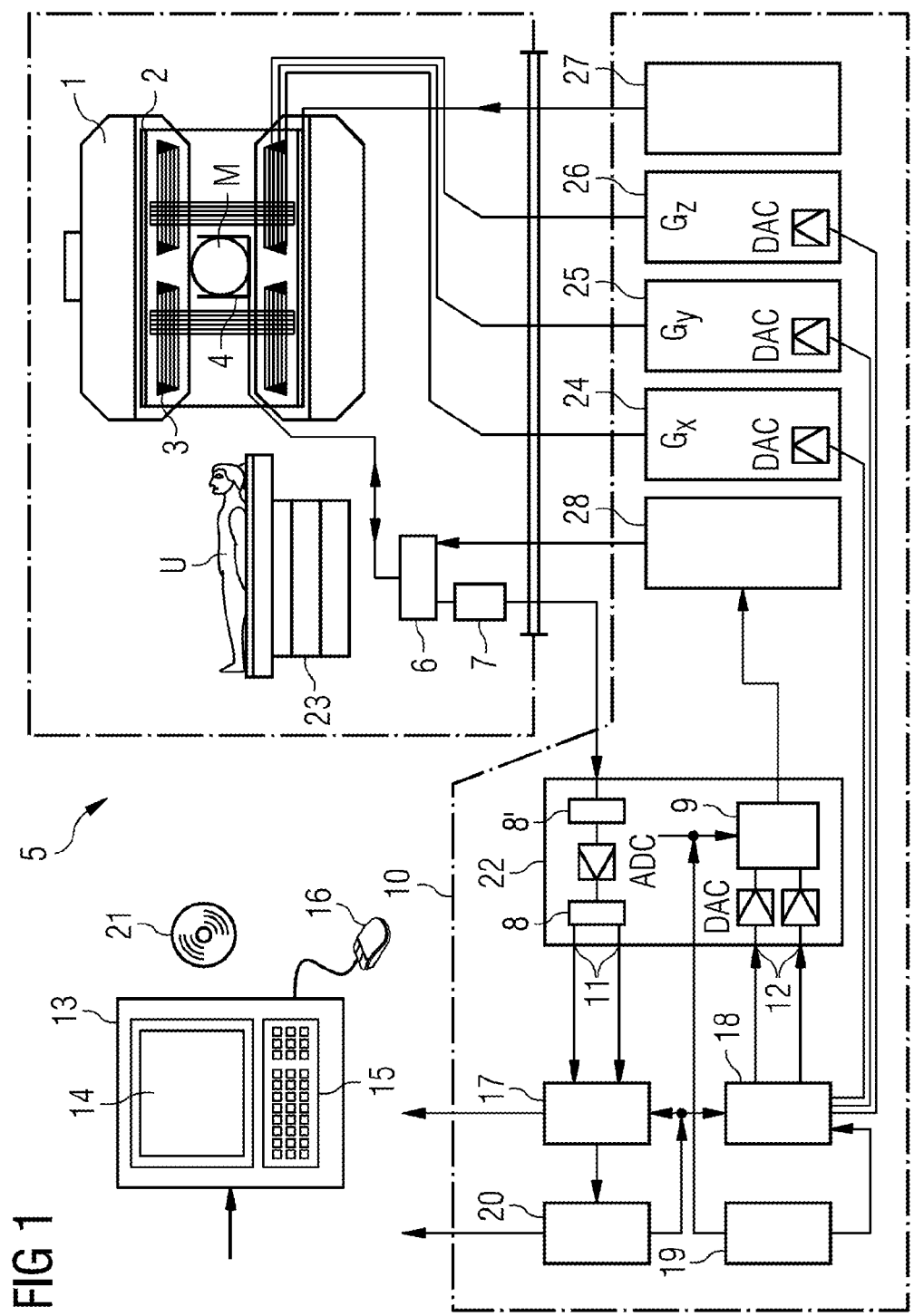
FIG. 1 shows schematically a magnetic resonance system in accordance with an embodiment of the present invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In accordance with at least one embodiment of the present invention, a method is provided for imaging a part region of the examination object in a magnetic resonance system. The part region is disposed at the edge of a field of view of the magnetic resonance system. In the method, a first gradient field is created such that, at a first predetermined position at the edge of the field of view, a distortion caused by a non-linearity of the first gradient field and a distortion caused by a $B_0$ field inhomogeneity cancel each other out.

By way of the first gradient field, first magnetic resonance data is detected which contains the first predetermined position. A second gradient field is created such that, at a second predetermined position at the edge of the field of view, a distortion caused by a non-linearity of the second gradient field and a distortion caused by a $B_0$ field inhomogeneity cancel each other out. By way of the second gradient field, second magnetic data is detected which contains the second predetermined position.

The first predetermined position and the second predetermined position are different and can for example be selected such that the first predetermined position is in the region of one arm of the patient at the edge of the field of view and the second predetermined position is in the region of a patient's stomach at the edge of the field of view. A first readout direction, in which the first magnetic resonance data is detected, is selected as a function of a location of the first predetermined position and a second readout direction, in which the second magnetic resonance data is detected, is selected as a function of a location of the second predetermined position. The first readout direction and the second readout direction are different.

To put it in another way, the first readout direction and the second readout direction run at a specific angle to one another. From the first magnetic resonance data and the second magnetic resonance data, an image of the part region of the examination object at the first predetermined position and an image of the part region of the examination object at the second predetermined position are determined.

Since the non-linearity of the gradient field depends on the gradient field strength and the $B_0$ field inhomogeneities are independent of the gradient field strength, the gradient field can be set and created at least for the first or second predefined position of the field of view or for corresponding predefined regions of the field of view such that the non-linearity of the gradient field and the $B_0$ field inhomogeneity at these locations or in these regions cancel each other out. This enables a distortion for the first predetermined position and the second predetermined position or for the predefined regions to be avoided.

The term "distortion" is used in this context such that a signal value of a predetermined position (x, y, z) of the examination object, especially at the first predetermined position or at the second predetermined position at the edge of the field of view, appears in the image of the examination object determined from the detected magnetic resonance data at another location ($x_1$, $y_1$, $z_1$). The coordinates (x, y, z) are also referred to as the actual position and the coordinates ($x_1$, $y_1$, $z_1$) are also referred to as the distorted position. Distortions can occur in particular in the edge areas of the field of view which cannot be compensated for by subsequent smoothing of the image, since for example a number of adjacent actual positions at one or more of the distorted positions lying close to one another can be imaged. In that, by creating a suitable gradient field, the non-linearity of the gradient field and the $B_0$ field inhomogeneity at the first or second predetermined position cancel each other out, no distortions or only small distortions occur for this region, so that in this region a usable image of the examination object can be determined. Through the different readout directions locations at many different positions in the edge region of the field of view with small distortions or free from distortions can be detected.

To put it another way, in the method previously described a radial acquisition strategy is used. In this case the k-space is sampled radially for each slice. This is also referred to as a "stack of stars". With a typical radial sequence the angle between the individual projections within a slice is equidistant. A scaling of the readout gradients of each individual projection is optimized by different gradient amplitudes according to the distortion compensation. The gradient amplitudes can be set by the bandwidth. Thus, for each projection, handling is in accordance with its alignment.

In accordance with an embodiment, the first readout direction passes radially from the center of the field of view through the first predetermined position and the second readout direction passes radially from the center of the field of view through the second predetermined position. The angle between the first readout direction the second readout direction can lie in a range of 0-90° for example. Radial sampling makes imaging with little or no distortion possible even at extreme positions outside the usually specified field of view.

By comparison with a Cartesian sampling, which only expands the field of view in one dimension per measurement, radial sampling makes possible a reduction of the distortion in two or even three dimensions. Through this all regions of interest which are located outside the specified field of view, for example arms or stomach of the patient, can be optimized at the same time. Thus the aforementioned applications, such as MR-PET hybrid applications or MR-based interventions or radiation planning for example, benefit fundamentally from the expanded distortion-free imaging in the edge area of the field of view. In addition the method offers the advantages of radial sampling, such as e.g. the reduction of movement artifacts and aliasing. With dynamic, temporally highly-resolved acquisition so-called "undersampling" acquisition strategies can also be applied, in which after an acquisition in each case images are reconstructed in the k-space from just a few lines or projections.

In accordance with a further embodiment, to create the first gradient field a relative gradient error is determined at the first predetermined position at the edge of the field of view. Furthermore the $B_0$ field inhomogeneity is defined at the first predetermined position. The relative gradient error and the $B_0$ field inhomogeneity can for example be defined in advance by dimensioning the magnetic resonance system. Depending on the relative gradient error and the $B_0$ field inhomogeneity at the first predetermined position, a first gradient field strength of the first gradient field is determined and created accordingly during acquisition of the first magnetic resonance data.

The first gradient field strength $G_1$ of the first gradient field can be determined according to the following equation $$G_1 = -dB_0(x_1,y_1,z_1)/c_1(x_1,y_1,z_1).$$

$dB_0$ identifies the $B_0$ field inhomogeneity at the first predetermined position ($x_1$, $y_1$, $z_1$) and $c_1$ is the relative gradient error at the first predetermined position. Once the magnetic resonance system has been dimensioned, i.e. the relative gradient error and the $B_0$ field inhomogeneity have been determined for a specified position or regions, gradients of the gradient field can thus be defined and created in a simple manner to enable an image of the examination object at the predetermined position to be defined reliably, i.e. without distortion or with only slight distortion.

To create the second gradient field, a second gradient field strength $G_2$ can be defined in accordance with the equation $$G_2 = -dB_0(x_2,y_2,z_2)/c_2(x_2,y_2,z_2).$$

For this purpose the $B_0$ field inhomogeneity $dB_0$ at the second predetermined position ($x_2$, $y_2$, $z_2$) and a relevant gradient error $c_2$ at the second predetermined position at the edge of the field of view are defined.

For creating the gradient field, the $B_0$ field inhomogeneity at the first and/or the second predetermined position can be determined and a gradient coil for creating the gradient field can be embodied such that, at the first or second predetermined position, a non-linearity of the gradient field and the $B_0$ field cancel each other out. Since for example for a PET attenuation correction usually only a few regions at the edge of the field of view of the magnetic resonance system are to be acquired without distortion, in which it is likely that the arms and the stomach of the patient are located, a gradient coil can be optimized to the extent that the non-linearity of the gradient coil for a predefined gradient field essentially cancels out the $B_0$ field inhomogeneity in these regions. This enables a distortion-free imaging of the arms and of the stomach of the examination object to be achieved.

As an alternative or in addition, for creating the gradient field, the non-linearity of the gradient field at the first and/or second predetermined position can be determined and the $B_0$ field can be modified such that, at the first or second predetermined position the non-linearity of the gradient field and the $B_0$ field inhomogeneity cancel each other out. The modification of the $B_0$ field can for example be set by a suitable arrangement of what are known as shims. This enables a small distortion to be achieved at least for a few areas, for example areas in which the arms and the stomach of the patient would be expected to lie.

In accordance with a further embodiment, the method is used in conjunction with a magnetic resonance system with a tunnel-shaped opening for accepting the examination object. The edge of the field of view of this magnetic resonance system usually comprises a jacket area along and inner surface of the tunnel-shaped opening. The jacket area can for example have a jacket thickness of approximately 5 cm, while the inner diameter of the tunnel-shaped opening amounts to approximately 60 cm. As previously described, the part region of the examination object to be imaged can include an anatomical structure of the patient, for example an arm of the patient or the stomach of the patient, which is disposed at the edge of the field of view of the magnetic resonance system. Preferably the magnetic resonance data is acquired in a transversal plane in relation to the examination object. The low distortion enables the location of the part regions, i.e. the arms and/or the stomach, to be reliably determined in a specific image of the examination object.

In accordance with a further embodiment, as a function of the imaging of the part region of the examination object at the first and/or second predetermined position, an attenuation correction for a positron emission tomography is determined. Because of the low distortion the location of the part region, for example of an arm or a stomach, can be reliably determined from the image of the examination object. With a positron emission tomography, taking account of received radiation (photons) through the structure or anatomy of the examination object in the beam direction is of decisive importance. By enabling the location of the part region of the examination object to be determined even at the edge of the field of view of the magnetic resonance system, an overall determination of the location and structure of the examination object in the magnetic resonance system is reliably possible and thus a precise attenuation correction is able to be carried out for a positron emission tomography.

In accordance with an embodiment of the invention, a magnetic resonance system is also provided which has a control device for controlling a tomograph with a magnet for generating a $B_0$ field, a receive facility for receiving signals accepted by the tomograph and an evaluation facility for evaluating the signals and creation of magnetic resonance images. The magnetic resonance system is capable of creating a first gradient field such that, at a first predetermined position at the edge of the field of view, a distortion caused by a non-linearity of the first gradient field and a distortion caused by a $B_0$ field inhomogeneity cancel each other out. With the aid of the first gradient field thus created the magnetic resonance system creates first magnetic resonance data which contains the first predetermined position.

The magnetic resonance system further creates a second gradient field such that, at a second predetermined position at the edge of the field of view, a distortion caused by a non-linearity of the second gradient field and a distortion caused by a $B_0$ field inhomogeneity cancel each other out.

By way of the second gradient field, the magnetic resonance system acquires second magnetic resonance data which contains the second predetermined position. The first magnetic resonance data is acquired in a first readout direction which is selected as a function of a location of the first predetermined position. The second magnetic resonance data is acquired in a second readout direction, which is selected as a function of the location of the second predetermined position. The first readout direction and the second readout direction are different.

For example the first readout direction and the second readout direction can pass radially from a center of the field of view of the magnetic resonance system through the first predetermined position or through the second predetermined position. From the first magnetic resonance data and the second magnetic resonance data the magnetic resonance system determines an image of a part region of the examination object at the first predetermined position and an image of the part region of the examination object at the second predetermined position.

In accordance with an embodiment the magnetic resonance system further acquires a positron emission tomograph and, as a function of the image of the examination object at the first and second predetermined position, can automatically determine an attenuation correction for a positron emission tomography.

Furthermore the magnetic resonance system can be embodied to carry out the previously described method and its embodiments and therefore has the advantages described above.

In accordance with an embodiment of the present invention, a computer program product is also provided, which can be loaded into a memory of a programmable controller of a magnetic resonance system. The computer program product can especially comprise software. With program segments/modules of this computer program product, all previously described embodiments of the inventive method can be executed when the computer program product is executed in the magnetic resonance system.

In accordance with an embodiment of the invention, an electronically-readable data medium, for example a CD or DVD, is also provided, on which electronically-readable control information, especially software, is stored. When this control information is read from the data medium and stored in a control unit of the magnetic resonance system, all inventive embodiments of the previously described method can be carried out with the magnetic resonance system.

FIG. 1 shows a schematic diagram of a magnetic resonance system 5, which is also referred to as a magnetic resonance imaging system or nuclear resonance tomography system. A basic field magnet 1 creates a temporally constant strong magnetic field $B_0$ for polarization or alignment of nuclear spin in an examination area of an examination object U, such as e.g. an area of a human body to be examined, which lies on a table 23 and is pushed into the magnetic resonance system 5. The high homogeneity of the basic magnetic field $B_0$ required for the nuclear magnetic resonance measurement is defined in a typically spherical measurement volume M, into which the parts of the human body to be examined are brought. To support the homogeneity requirements and especially for eliminating temporally-invariable influences, so-called shims made of ferromagnetic material are attached at suitable points. Temporally-variable influences are eliminated by shim coils 2 and a suitable activation 27 of the shim coils 2.

In the basic field magnets 1 a cylindrical gradient field system 3 is employed, which includes three part windings for example. Each part winding is supplied by a corresponding amplifier 24-26 with current for creating a linear gradient field in the respective direction of a Cartesian coordinate system. The first part winding of the gradient field system 3 in this case creates a gradient $G_x$ in the x-direction, the second part winding creates a gradient $G_y$ in the y-direction and the third part winding creates a gradient $G_z$ in the z-direction. The amplifier 24-26 includes a Digital-Analog Converter (DAC), which is activated by a sequence controller 18 for the creation of a gradient pulses at the correct time.

Located within the gradient field system 3 is a radio-frequency antenna 4, which converts the radio-frequency pulses emitted by the radio-frequency power amplifier into a magnetic alternating field to excite the nuclei and align the nuclear spin of the object to be examined or of the area to be examined. The activation of the coils and the evaluation of received signals occurs in a control device 10. The radio-frequency antenna 4 includes one or more RF transmit coils and a number of RF receive coils in a typically ring-shaped, linear or matrix-shaped arrangement of coils.

From the RF receive coils of the radio-frequency antenna 4 the alternating field emanating from the preceding nuclear spin, i.e. as a rule the nuclear spin echo signals caused by a pulse sequence or one or more radio-frequency pulses and one or more gradient pulses, is converted into a voltage (measurement signal), which is fed by an amplifier 7 to a radio-frequency receive channel of a radio-frequency system 22. The radio-frequency system 22 further comprises a transmit channel 9 in which the radio-frequency pulses for the excitation of the magnetic nuclear spin are created.

In such cases the respective radio-frequency pulses are represented in the sequence control 18 digitally as a sequence of complex numbers on the basis of a pulse sequence predetermined by a system processor 20. This numerical sequence is supplied as a real part and as an imaginary part via an input 12 in each case to a digital-analog converter (DAC) in the radio-frequency system 22 and supplied from this to the transmit channel 9. In the transmit channel 9 the pulse sequences are modulated up to a radio-frequency carrier signal of which the basic frequency corresponds to the resonance frequency of the nuclear spin in the measurement volume. The modulated pulse sequences of the RF transmit coil are fed to the radio-frequency antenna 4 via a transformer 28.

The switchover from transmit to receive mode is made via a transceiver switch 6. The RF transmit coil of the radio frequency antenna 4 transmits the radio frequency pulses for exciting the nuclear resonance into the measurement volume M and samples resulting echo signals via the RF receive coils. The nuclear resonance signals obtained accordingly are demodulated in a first demodulator 8' of the receive channel of the radio-frequency system 22 in a phase-sensitive manner to an intermediate frequency and are digitized in the analog-digital converter (ADC). This signal is again demodulated to the frequency zero.

The demodulation to the frequency zero and the separation into real and imaginary part takes place after the digitization in the digital domain in a second demodulator 8 of the receive channel, which outputs the demodulated data via outputs 11 to an image processor 17. Through the image processor 17, an MR image is reconstructed from the measurement data obtained in this way. The measurement data, the image data and the control programs are managed via the system processor 20.

On the basis of a specification with control programs, the sequence control 18 checks the creation of the respective desired pulse sequences and the corresponding sampling of the k-space. In particular the sequence control 18 in such cases controls the timely switching of the gradients, the transmission of the radio-frequency pulses with defined phase amplitude and also the receiving of the nuclear resonance signals. The time base for the radio-frequency system 22 and the sequence control 18 is provided by a synthesizer 19. The selection of corresponding control programs for creating an MR image, which are stored for example on a data medium such as a DVD 21, as well as the presentation of the created MR image is undertaken via a terminal 13 which has a keyboard 15, a mouse 16 and a screen 14.

The measurement volume M, which is also called the Field of View (FOV), is restricted on the hardware side by the $B_0$ field homogeneity and the linearity of the gradient field.

Figure 2:
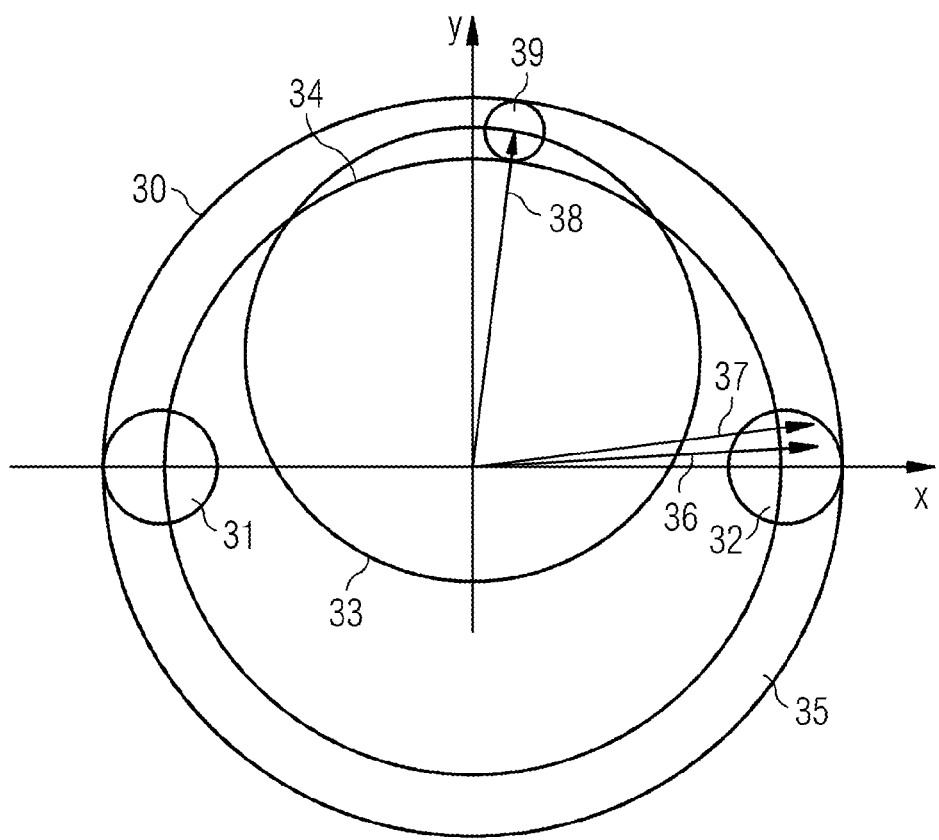
FIG. 2 shows schematically a cross-sectional view of a patient in a tunnel-shaped opening of a magnetic resonance system.

FIG. 2 shows by way of example a cross-sectional view of a tunnel-shaped opening 30 of a magnetic resonance system with an examination object 31-33 disposed therein. Part regions 31 and 32 of the examination object represent arms of the patient in cross-section for example and the part region 33 represents the torso of the patient. The hardware-side restrictions mean that the field of view is normally only usable within the circle 34.

A jacket area 35 between the usable field of view 34 and an inner surface of the tunnel-shaped opening 30 is referred to as the edge area of the field of view or as the expanded field of view. Measurements in the jacket area 35, i.e. outside the specified field of view 34, exhibit $B_0$ field inhomogeneities and non-linearities of the gradient field and therefore lead to heavy distortions.

Areas of the examination object which are disposed outside the specified field of view 34 can therefore appear in the magnetic resonance imaging at a point at which they are not located in actual fact. With a magnetic resonance tomograph, with for example a tunnel diameter of 60 cm, the specified field of view usually has a diameter of 50 cm for example.

In the edge area 35 along the inner surface of the tomograph the distortion therefore occurs in a range of appr. 5 cm. However, as is shown in FIG. 2, the arms 31, 32 and a part of the torso 34, for example the stomach of the patient, are located in this area for example. Through the distortion the position of the arms 31, 32 and of the abdomen of the patient are reproduced incorrectly in the magnetic resonance image. Therefore the magnetic resonance images in this area are not able to be used for a human attenuation correction in MR-PET hybrid systems.

The distortions which occur in the edge area 35 depend on the field deviation $dB_G$ or $dB_0$ relative to the nominal value and on the gradient field strength G. To enable a low-distortion or distortion-free imaging of part regions of the examination object to be obtained at different positions in the edge area 35, sampling is radial in the k-space, wherein the scaling of the readout gradients of each individual projection will be optimized by a different gradient amplitude, which is set by the bandwidth in accordance with the distortion compensation. The straight projection lines through the k-space origin correspond to the Fourier-transformed projections in the position space.

FIG. 4(a) shows a line 50 of the k-space which passes through the origin at an angle Φ, which is labeled with the reference character 51. The line 50 is the Fourier transformation of the projection P (Φ, t) of an object 52 shown in FIG. 4(b) with rays 53-56 at right angles to a line 57 at the same angle Φ. In accordance with the Fourier slice theory a Fourier-transform of a rotated projection produces values of a Fourier-transformed image on a rotated ray through the coordinate origin. On the basis of the Fourier slice theorem the radial sampling on a projection in the k-space can be viewed in each case as a rotated Cartesian sampling through the k-space center.

FIG. 5 illustrates this relationship. With a radial sampling the k-space can be scanned radially in a slice-selective manner for each slice for example. In FIG. 2 for example three readout gradients, 36, 37 and 38, are shown for three straight line projections. For a distortion along a straight line projection i, which is assigned to one of the gradients 36, 37 or 38 for example, the following equation applies:

$$r_i' = r_i + dB_{Gi}(x,y,z)/G_i + dB_0(x,y,z)/G_i$$

wherein $r_i'$ is the distorted position and $r_i$ is the undistorted position along the projection i, $dB_{Gi}$ (x, y, z) is the magnetic field caused by the non-linearity of the gradient i at the position (x, y, z) and $dB_0$ (x, y, z) is the inhomogeneity at the position (x, y, z). With the aid of the above equation an optimum gradient amplitude $G_i$ can be found for each projection i, which minimizes the distortion $r_i'$. The position (x, y, z) can for example be determined such that it defines the imaging area 39 of the respective projection in the outer expanded field of view.

Instead of the previously described slice-selective radial sampling, a complete three-dimensional radial sampling can also be carried out. In such cases the excitation is not selective and the alignment of the readout projections travels over a spherical surface of the field of view.

The radial sampling enables part regions of the examination object to be acquired at different positions in the edge area 35 of the field of view of the magnetic resonance system with low distortion or distortion-free. By comparison with Cartesian sampling, with which the field of view can merely be expanded in one dimension per measurement, the radial sampling can make it possible to reduce distortion in two or three dimensions. In addition a radial sampling can reduce the movement artifacts or aliases, so-called foldback artifacts, in which an object outside the specified field of view 34 appears within the specified field of view 34.

Figure 3:
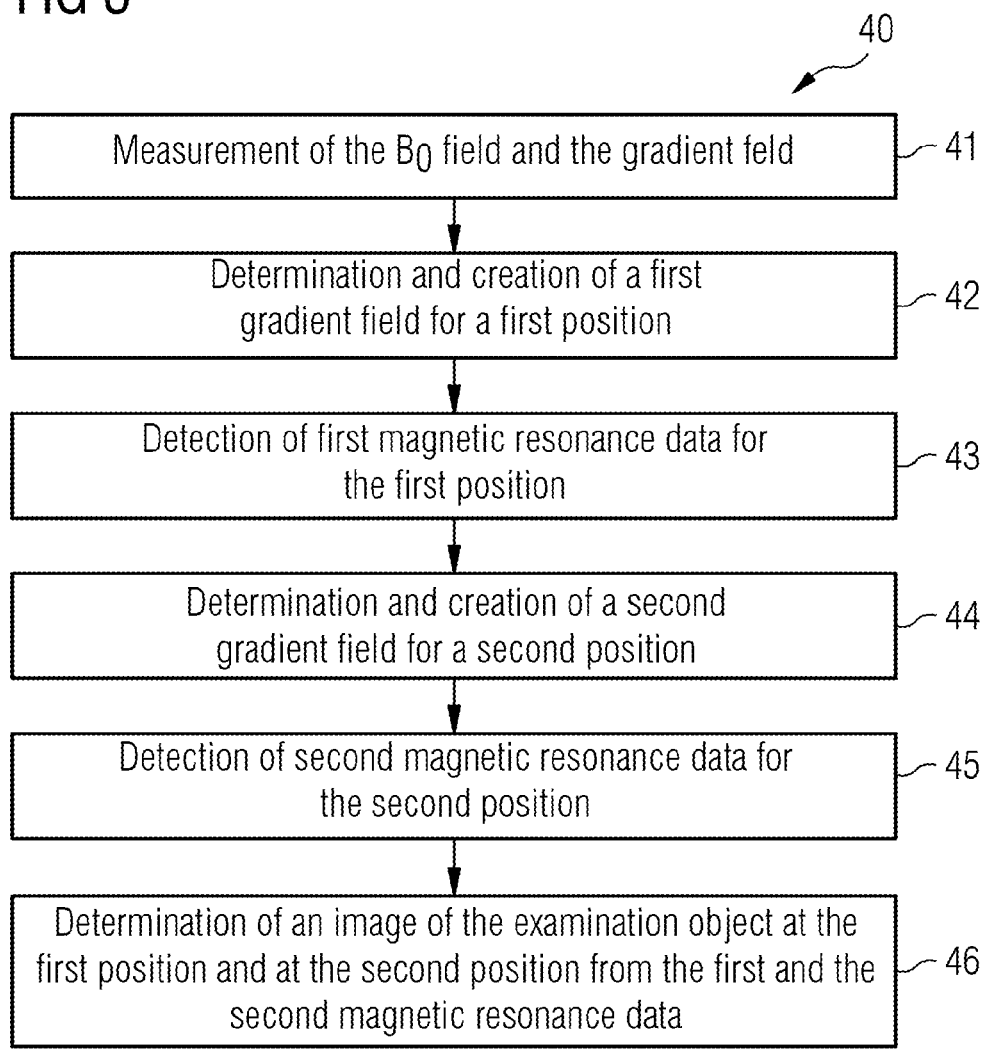
FIG. 3 shows a flow diagram of the method in accordance with an embodiment of the present invention.

To determine a distortion-corrected image of an examination object the method steps described below in conjunction with FIG. 3 can be carried out for example. In the method 40 shown in FIG. 3, first of all, in step 41, the B0 field and the gradient field of the magnetic resonance system are defined and dimensioned in order to define the B0 field inhomogeneities and the relative gradient error of the magnetic resonance system. Then, in step 42, an optimum gradient strength for a slice-selection gradient and a readout gradient for a first position are defined.

The first position can for example be a position in the area of the arm 32 of FIG. 2. This enables the non-linearity of the gradient field and the $B_0$ field inhomogeneity to be overlaid destructively at the desired position. Using the calculated gradient fields, in step 43 first magnetic resonance data is acquired for the first position. In step 44, comparably to step 42, a second gradient field for a second position is defined. The second position can for example be a position in the area 39, in order to obtain a positionally-faithful image of the stomach of the patient. In step 45 second magnetic resonance data for the second position is acquired using the second gradient field.

For further positions in the edge area 35 further gradient fields can be defined and with these gradient fields further magnetic resonance data can be acquired. The magnetic resonance data thus fills the k-space, so that from the magnetic resonance data in step 46 an image of the examination object at the first position and the second position and if necessary at further positions can be defined free from distortions or with low distortions.

The previously described method can be combined for example with what is known as a TimCT implementation. In TimCT (Total Imaging Matrix Computer Tomography) technology the patient is moved continuously through the magnetic resonance system while the magnetic resonance data is acquired. In combination with the previously described method the magnetic resonance data is acquired radially for a two-dimensional slice as described previously while the patient is moved through this slice. The slice is selected such that a distortion which is as small as possible in the edge area 35 can be achieved there. This enables a positionally-faithful image of the patient on the patient table to be determined.

For temporal optimization the previously described method can be defined with acquisition technologies BLADE, PROPELLER or a TSE known from the prior art, wherein a number of projections are read out during an excitation cycle. To guarantee a consistent contrast, in the k-space center, which, depending on the acquisition is already oversampled in any event, only projections with the same echo time can be used and the remainder discarded.

The previously described method can also be combined with randomly distributed acquisitions of projections, through which compressed-sensing reconstruction methods known in the prior art can be realized.

Since each projection contains information from two image halves, namely the optimized side and the distorted side, the information of the optimized image half is extracted from each projection. This can be performed for example with a suitable Fourier method. As an alternative each projection can also be individually Fourier-transformed and subsequently the optimized half extracted in the position space, transformed back and assembled and reconstructed accordingly in the k-space along with other projections. The common zero crossing of all individual projections can be ensured by oversampling and if necessary a phase correction. The necessary echo time available depending on the optimum gradient amplitude can either be selected individually for each individual projection, by which a short acquisition time for if necessary different contrast behavior is achieved, or the greatest necessary echo time can be selected from each projection, by which the acquisition times increase, but an even contrast behavior is achieved.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Although the invention has been illustrated and described in detail on the basis of the preferred example embodiment, the invention is not limited by the disclosed examples and other variations can be derived herefrom by the person skilled in the art, without departing from the scope of protection of the invention.

What is claimed is:

1. A method for imaging a part region of an examination object in a magnetic resonance system, wherein the part region is disposed at an edge of a field of view of the magnetic resonance system, said method comprising:
   creating a first gradient field such that, at a first position at the edge of the field of view, a distortion caused by a non-linearity of the first gradient field and a distortion caused by a $B_0$-field inhomogeneity cancel each other out;
   acquiring first magnetic resonance data, which contains the first position, by way of the first gradient field;
   creating a second gradient field such that, at a second position at the edge of the field of view, a distortion caused by a non-linearity of the second gradient field and a distortion caused by a $B_0$-field inhomogeneity cancel each other out;
   acquiring second magnetic resonance data which contains the second position, by way of the second gradient field;
   selecting a first readout direction, in which the first magnetic resonance data is acquired, as a function of a location of the first position and selecting a second readout direction, in which the second magnetic resonance data is acquired, as a function of a location of the second position, the first readout direction and the second readout direction being different; and
   determining an image of the part region of the examination object at the first position and the second position from the first and second magnetic resonance data.

2. The method of claim 1, wherein the first readout direction passes radially from a center of the field of view through the first position and the second readout direction passes radially from a center of the field of view through the second position.

3. The method of claim 1, wherein an angle between the first readout direction and the second readout direction is greater than zero degrees and less than 90 degrees.

4. The method of claim 1, wherein the creating of the first gradient field further comprises:
   determining a first relative gradient error at the first position;
   determining the $B_0$-field inhomogeneity at the first position; and
   determining a first gradient field strength of the first gradient field as a function of the first relative gradient error and the $B_0$-field inhomogeneity at the first position.

5. The method of claim 4, wherein the first gradient field strength $G_1$ of the first gradient field is determined according to a formula $$G_1 = -dB_0(x_1, y_1, z_1)/c_1(x_1, y_1, z_1),$$

wherein $dB_0$ is the $B_0$-field inhomogeneity at the first position $(x_1, y_1, z_1)$ at the edge of the field of view and $c_1$ is the first relative gradient error at the first position $(x_1, y_1, z_1)$ at the edge of the field of view.

6. The method of claim 1, wherein the creating of the second gradient field further comprises:
   determining a second relative gradient error at the second position,
   determining the $B_0$-field inhomogeneity at the second position, and determining a second gradient field strength of the first gradient field as a function of the second relative gradient error and the $B_0$-field inhomogeneity at the second position.

7. The method of claim 6, wherein the second gradient field strength $G_2$ of the second gradient field is determined according to a formula $$G_2 = -dB_0(x_2,y_2,z_2)/c_2(x_2,y_2,z_2),$$

wherein $dB_0$ is the $B_0$-field inhomogeneity at the second position $(x_2,y_2,z_2)$ at the edge of the field of view and $c_2$ is the second relative gradient error at the second position $(x_2,y_2,z_2)$ at the edge of the field of view.

8. The method of claim 1, wherein the part region of the examination object comprises an anatomical structure of a patient, which is disposed at the edge of the field of view of the magnetic resonance system.

9. The method as claimed in claim 8, wherein at least one of:
the anatomical structure at the first position comprises an arm of the patient; and
the anatomical structure at the second position comprises a stomach of the patient.

10. The method of claim 1, wherein the magnetic resonance system includes a tunnel-shaped opening to accept the examination object, and wherein the edge of the field of view comprises a jacket area along an inner surface of the tunnel-shaped opening.

11. The method of claim 10, wherein the jacket area includes a jacket thickness of approximately 5 cm.

12. The method of claim 1, wherein at least one of the first and second magnetic resonance data is acquired in a transversal plane in relation to the examination object.

13. The method of claim 1, wherein an attenuation correction for a positron emission tomography is determined as a function of imaging the part region of the examination object.

14. A magnetic resonance system, comprising:
a basic field magnet;
a gradient field system;
a radio-frequency antenna; and
a control device, configured to control the gradient field system and the radio-frequency antenna, for receiving measurement signals accepted from the radio-frequency antenna, for evaluating the measurement signals and for creating magnetic resonance images of an examination object in a field of view of the magnetic resonance system, and
wherein the magnetic resonance system is designed,
to create a first gradient field such that, at a first position at an edge of the field of view, a distortion caused by a non-linearity of the first gradient field and a distortion caused by a $B_0$-field inhomogeneity cancel each other out,
to acquire first magnetic resonance data which contains the first position, by way of the first gradient field,
to create a second gradient field such that, at a second position at the edge of the field of view, a distortion caused by a non-linearity of the second gradient field and a distortion caused by a $B_0$-field inhomogeneity cancel each other out,
to acquire second magnetic resonance data which contains the second position, by way of the second gradient field, wherein a first readout direction, in which the first magnetic resonance data is acquired, is selected as a function of a location of the first position and a second readout direction, in which the second magnetic resonance data is acquired, is selected as a function of a location of the second position, wherein the first readout direction and the second readout direction are different, and
to determine an image of a part region of the examination object at the first position and the second position from the first magnetic resonance data and from the second magnetic resonance data.

15. The magnetic resonance system of claim 14, further comprising a positron emission tomograph.

16. A computer program product, stored on a non-transitory computer-readable medium of a programmable controller of a magnetic resonance system, including program segments executable by a processor of the programmable controller to perform to execute the method of claim 1.

17. A non-transitory electronically-readable data medium including electronically-readable control information stored thereon, which is embodied in a control device of a magnetic resonance system, wherein execution of the electronically-readable control information causes a processor of the control device to perform the method of claim 1.

18. A computer program product, stored on a non-transitory computer-readable medium of a programmable controller of a magnetic resonance system, including program segments executable by a processor of the programmable controller to perform the method of claim 2.

19. A non-transitory electronically-readable data medium including electronically-readable control information stored thereon, which is embodied in a control device of a magnetic resonance system, wherein execution of the electronically-readable control information causes a processor of the control device to perform the method of claim 2.

20. The method of claim 2, wherein an angle between the first readout direction and the second readout direction is greater than zero degrees and less than 90 degrees.

21. The method of claim 2, wherein the creating of the first gradient field further comprises:
determining a first relative gradient error at the first position;
determining the $B_0$-field inhomogeneity at the first position; and
determining a first gradient field strength of the first gradient field as a function of the first relative gradient error and the $B_0$-field inhomogeneity at the first position.

22. The method of claim 4, wherein the creating of the second gradient field further comprises:
determining a second relative gradient error at the second position,
determining the $B_0$-field inhomogeneity at the second position, and
determining a second gradient field strength of the first gradient field as a function of the second relative gradient error and the $B_0$-field inhomogeneity at the second position.

23. The method of claim 5, wherein the creating of the second gradient field further comprises:
determining a second relative gradient error at the second position,
determining the $B_0$-field inhomogeneity at the second position, and
determining a second gradient field strength of the first gradient field as a function of the second relative gradient error and the $B_0$-field inhomogeneity at the second position.

24. The method of claim 23, wherein the second gradient field strength $G_2$ of the second gradient field is determined according to a formula $$G_2 = -dB_0(x_2,y_2,z_2)/c_2(x_2,y_2,z_2),$$

wherein $dB_0$ is the $B_0$-field inhomogeneity at the second position $(x_2,y_2,z_2)$ at the edge of the field of view and $c_2$ is the second relative gradient error at the second position $(x_2,y_2,z_2)$ at the edge of the field of view.

25. A computer program product, stored on a non-transitory computer-readable medium of a programmable controller of a magnetic resonance system, including program segments executable by a processor of the programmable controller to perform the method of claim 4.

26. A non-transitory electronically-readable data medium including electronically-readable control information stored thereon, which is embodied in a control device of a magnetic resonance system, wherein execution of the electronically-readable control information causes a processor of the control device to perform the method of claim 4.

27. A computer program product, stored on a non-transitory computer-readable medium of a programmable controller of a magnetic resonance system, including program segments executable by a processor of the programmable controller to perform the method of claim 6.

28. A non-transitory electronically-readable data medium including electronically-readable control information stored thereon, which is embodied in a control device of a magnetic resonance system, wherein execution of the electronically-readable control information causes a processor of the control device to perform the method of claim 6.

29. A computer program product, stored on a non-transitory computer-readable medium of a programmable controller of a magnetic resonance system, including program segments executable by a processor of the programmable controller to perform the method of claim 22.

30. A non-transitory electronically-readable data medium including electronically-readable control information stored thereon, which is embodied in a control device of a magnetic resonance system, wherein execution of the electronically-readable control information causes a processor of the control device to perform the method of claim 22.

* * * * *